United States Patent
Ishimoto

(10) Patent No.: US 11,880,218 B2
(45) Date of Patent: Jan. 23, 2024

(54) CURRENT OUTPUT CIRCUIT

(71) Applicant: Murata Manufacturing Co., Ltd., Kyoto (JP)

(72) Inventor: Kazuhiko Ishimoto, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 417 days.

(21) Appl. No.: 17/329,714

(22) Filed: May 25, 2021

(65) Prior Publication Data

US 2021/0278871 A1    Sep. 9, 2021

Related U.S. Application Data

(63) Continuation of application No. PCT/JP2019/045848, filed on Nov. 22, 2019.

(30) Foreign Application Priority Data

Nov. 26, 2018 (JP) ................. 2018-220476

(51) Int. Cl.
  *G05F 3/26* (2006.01)
  *G01R 19/165* (2006.01)
  *G05F 1/46* (2006.01)
  *H03F 3/193* (2006.01)

(52) U.S. Cl.
  CPC ....... *G05F 3/262* (2013.01); *G01R 19/16538* (2013.01); *G05F 1/461* (2013.01); *H03F 3/193* (2013.01)

(58) Field of Classification Search
  CPC ... G05F 3/262; G05F 1/461; G01R 19/16538; H03F 3/193; H03F 2200/91
  See application file for complete search history.

(56) References Cited

U.S. PATENT DOCUMENTS

| | | | |
|---|---|---|---|
| 6,150,800 A | 11/2000 | Kinoshita et al. | |
| 6,445,167 B1 | 9/2002 | Marty | |
| 2008/0290942 A1 | 11/2008 | Shimizu | |
| 2009/0273327 A1 | 11/2009 | Ito et al. | |
| 2012/0049817 A1* | 3/2012 | Willey | G05F 3/20 323/282 |

(Continued)

FOREIGN PATENT DOCUMENTS

| CN | 106560758 A | 4/2017 |
|---|---|---|
| CN | 107024954 A | 8/2017 |

(Continued)

OTHER PUBLICATIONS

International Search Report for International Patent Application No. PCT/JP2019/045848 dated Feb. 25, 2020.

(Continued)

*Primary Examiner* — Alex Torres-Rivera
(74) *Attorney, Agent, or Firm* — Pearne & Gordon LLP

(57) ABSTRACT

A current output circuit includes an input circuit that outputs a second current in response to a first current when the first current is inputted, an output circuit that outputs a third current in response to the second current, and a control circuit that causes the output circuit to output a current when a control signal is inputted before the first current is inputted to the input circuit. The output circuit includes transistors of a first group and the input circuit includes transistors of a second group.

20 Claims, 10 Drawing Sheets

(56) References Cited

U.S. PATENT DOCUMENTS

2012/0176198 A1\* 7/2012 Tanaka .................... H03F 3/345
　　　　　　　　　　　　　　　　　　　　　330/288
2016/0320790 A1\* 11/2016 Wu ......................... G05F 3/267
2017/0099033 A1\* 4/2017 Shimamune ............ H03F 3/191
2017/0222548 A1 8/2017 Takada et al.

FOREIGN PATENT DOCUMENTS

| JP | H10-283048 A | 10/1998 |
| JP | 2000-089840 A | 3/2000 |
| JP | 2007-166688 A | 6/2007 |
| JP | 2008-288900 A | 11/2008 |

OTHER PUBLICATIONS

Written Opinion for International Patent Application No. PCT/JP2019/045848 dated Feb. 25, 2020.

\* cited by examiner

CURRENT OUTPUT CIRCUIT

CROSS REFERENCE TO RELATED APPLICATIONS

This is a continuation of International Application No. PCT/JP2019/045848 filed on Nov. 22, 2019 which claims priority from Japanese Patent Application No. 2018-220476 filed on Nov. 26, 2018. The contents of these applications are incorporated herein by reference in their entireties.

BACKGROUND OF THE DISCLOSURE

Field of the Disclosure

The present disclosure relates to a current output circuit.

Description of the Related Art

A current mirror circuit and a cascode current mirror circuit are known as current output circuits for outputting a desired amount of current.

A current mirror circuit is described in Patent Document 1 below. A cascode current mirror circuit is described in Patent Document 2 below.

Patent Document 1: Japanese Unexamined Patent Application Publication No. 10-283048
Patent Document 2: Japanese Unexamined Patent Application Publication No. 2008-288900

BRIEF SUMMARY OF THE DISCLOSURE

An output terminal in a current output circuit may be at a low electric potential (zero volts, for example) when a current output is started. Accordingly, a high voltage (power supply voltage, for example) may be applied to a source-drain path of a transistor that outputs a current.

A transistor may have a low breakdown voltage due to miniaturization of the transistor or depending on a manufacturing process thereof. Accordingly, when a high voltage is applied to the source-drain path of the transistor, the transistor may be damaged, which causes a concern about reliability.

The present disclosure has been made in view of the above, and an object of the present disclosure is to inhibit a high voltage from being applied to a transistor and to improve reliability.

A current output circuit of an aspect of the present disclosure includes an input circuit outputting a second current in response to a first current when the first current is inputted, an output circuit outputting a third current in response to the second current, and a control circuit to cause the output circuit to output a current when a control signal is inputted before the first current is inputted to the input circuit. The output circuit includes transistors of a first group, and the input circuit includes transistors of a second group.

According to the present disclosure, it is possible to inhibit a high voltage from being applied to a transistor and to improve reliability.

DETAILED DESCRIPTION OF THE DISCLOSURE

Hereinafter, embodiments of current output circuits of the present disclosure will be described in detail with reference to the accompanying drawings. It should be noted that the present disclosure is not limited to the embodiments. Each embodiment is exemplary, and it is needless to say that partial replacement or combination of configurations described in different embodiments is possible. In a second embodiment and subsequent embodiments, the descriptions of the matters common to those in a first embodiment will be omitted, and only different points will be described. In particular, similar operational effects by similar configurations will not be described one by one for each embodiment.

First Embodiment

Hereinafter, the first embodiment will be described. First, in order to facilitate understanding of the first embodiment, a comparative example will be described.

COMPARATIVE EXAMPLE

Figure 1:
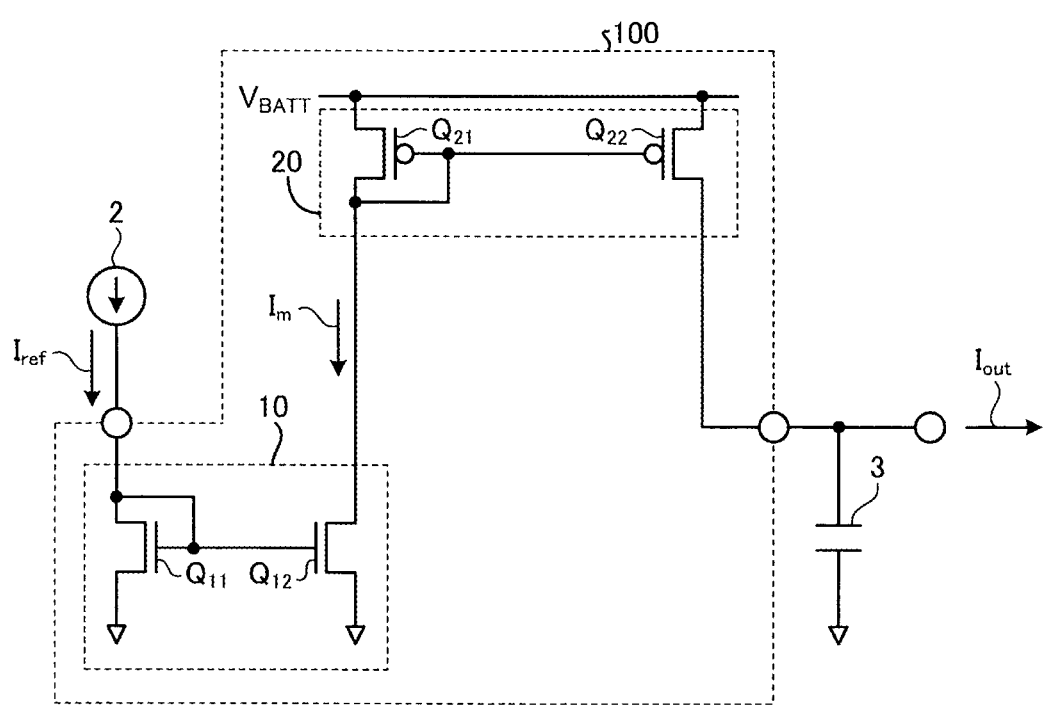
FIG. 1 is a diagram illustrating a circuit configuration of a current output circuit of a comparative example.

FIG. 1 is a diagram illustrating a circuit configuration of a current output circuit of the comparative example. A current output circuit 100 outputs an output current $I_{out}$ in response to an input current $I_{ref}$ inputted from a constant current source 2. The current output circuit 100 may be formed on one semiconductor chip (die).

A capacitor 3 for smoothing and stabilizing the output current $I_{out}$ is electrically connected between an output terminal of the current output circuit 100 and a reference electric potential. The reference electric potential is exemplified by a ground electric potential, but the present disclosure is not limited thereto.

The current output circuit 100 includes an input circuit 10 and an output circuit 20. The input circuit 10 outputs a current $I_m$ in response to the input current $I_{ref}$. The direction of the current $I_m$ is a direction from the output circuit 20 toward the input circuit 10. The output circuit 20 outputs the output current $I_{out}$ in response to the current $I_m$.

The input circuit 10 includes N-channel transistors $Q_{11}$ and $Q_{12}$.

In the present disclosure, each transistor is exemplified by a field effect transistor (FET), but is not limited thereto. Each transistor may be a heterojunction bipolar transistor (HBT), for example. Each transistor may be a multi-finger transistor in which unit transistors (also referred to as fingers) are electrically connected in parallel. The term "unit transistor" refers to a minimum configuration in which a transistor is configured.

The size (the number of fingers) of the transistor $Q_{11}$ and the size of the transistor $Q_{12}$ may be the same or different from each other.

A source of the transistor $Q_{11}$ is electrically connected to the reference electric potential. A drain and a gate of the transistor $Q_{11}$ are electrically connected to each other. The input current $I_{ref}$ is inputted to the drain and the gate of the transistor $Q_{11}$.

A source of the transistor $Q_{12}$ is electrically connected to the reference electric potential. A gate of the transistor $Q_{12}$ is electrically connected to the gate of the transistor $Q_{11}$. That is, the transistor $Q_{11}$ and the transistor $Q_{12}$ configure a current mirror circuit.

The current $I_m$ in response to the input current $I_{ref}$ flows through a drain of the transistor $Q_{12}$. For example, in a case that the size of the transistor $Q_{12}$ is the same as the size of the transistor $Q_{11}$, the current $I_m$ is the same as the input current $I_{ref}$. Further, for example, in a case that the size of the transistor $Q_{12}$ is ten times as large as the size of the transistor $Q_{11}$, the current $I_m$ is ten times as high as the input current $I_{ref}$.

The output circuit 20 includes P-channel transistors $Q_{21}$ and $Q_{22}$.

It is exemplified that the size of the transistor $Q_{21}$ is the same as the size of the transistor $Q_{12}$, but the present disclosure is not limited thereto. The size of the transistor $Q_{21}$ may be different from the size of the transistor $Q_{12}$.

The size of the transistor $Q_{21}$ and the size of the transistor $Q_{22}$ may be the same or different from each other.

A source of the transistor $Q_{21}$ is electrically connected to a power supply electric potential $V_{BATT}$. A drain and a gate of the transistor $Q_{21}$ are electrically connected to each other. The drain and the gate of the transistor $Q_{21}$ are electrically connected to the drain of the transistor $Q_{12}$. Accordingly, a drain current of the transistor $Q_{21}$ is the current $I_m$.

A source of the transistor $Q_{22}$ is electrically connected to the power supply electric potential $V_{BATT}$. A gate of the transistor $Q_{22}$ is electrically connected to the gate of the transistor $Q_{21}$. That is, the transistors $Q_{21}$ and $Q_{22}$ configure a current mirror circuit.

The output current $I_{out}$ in response to the current $I_m$ flows through a drain of the transistor $Q_{22}$. For example, in a case that the size of the transistor $Q_{22}$ is the same as the size of the transistor $Q_{21}$, the output current $I_{out}$ is the same as the current $I_m$. For example, in a case that the size of the transistor $Q_{22}$ is ten times as large as the size of the transistor $Q_{21}$, the output current $I_{out}$ is ten times as high as the current $I_m$.

For example, in a case that the size ratio of the transistors $Q_{11}$, $Q_{12}$, $Q_{21}$, and $Q_{22}$ is 1:10:10:100, the output current $I_{out}$ is 100 times as high as the input current $I_{ref}$.

The operation of the current output circuit 100 in activation (start of inputting the input current $I_{ref}$) will be described.

Before the activation of the current output circuit 100, the input current $I_{ref}$ is zero amperes. Accordingly, the current $I_m$ and the output current $I_{out}$ are also zero amperes. At this time, an electric charge amount of the capacitor 3 may be small. The voltage of the capacitor 3 is proportional to the electric charge amount. That is, the voltage of the capacitor 3 may be a low voltage.

For example, the electric charge amount of the capacitor 3 may be zero coulombs. That is, the voltage of the capacitor 3 may be zero volts.

When the constant current source 2 outputs the input current $I_{ref}$, the current output circuit 100 starts outputting the output current $I_{out}$. At this time, in a case that the voltage of the capacitor 3 is a low voltage (zero volts, for example), a high voltage (voltage $V_{BATT}$, for example) is applied to a source-drain path of the transistor $Q_{22}$.

The transistor $Q_{22}$ may have a low breakdown voltage due to miniaturization of a transistor or depending on a manufacturing process thereof. Accordingly, when a high voltage (voltage $V_{BATT}$, for example) is applied to the source-drain path of the transistor $Q_{22}$, the transistor $Q_{22}$ may be damaged, which causes the concern about reliability.

First Embodiment

Figure 2:
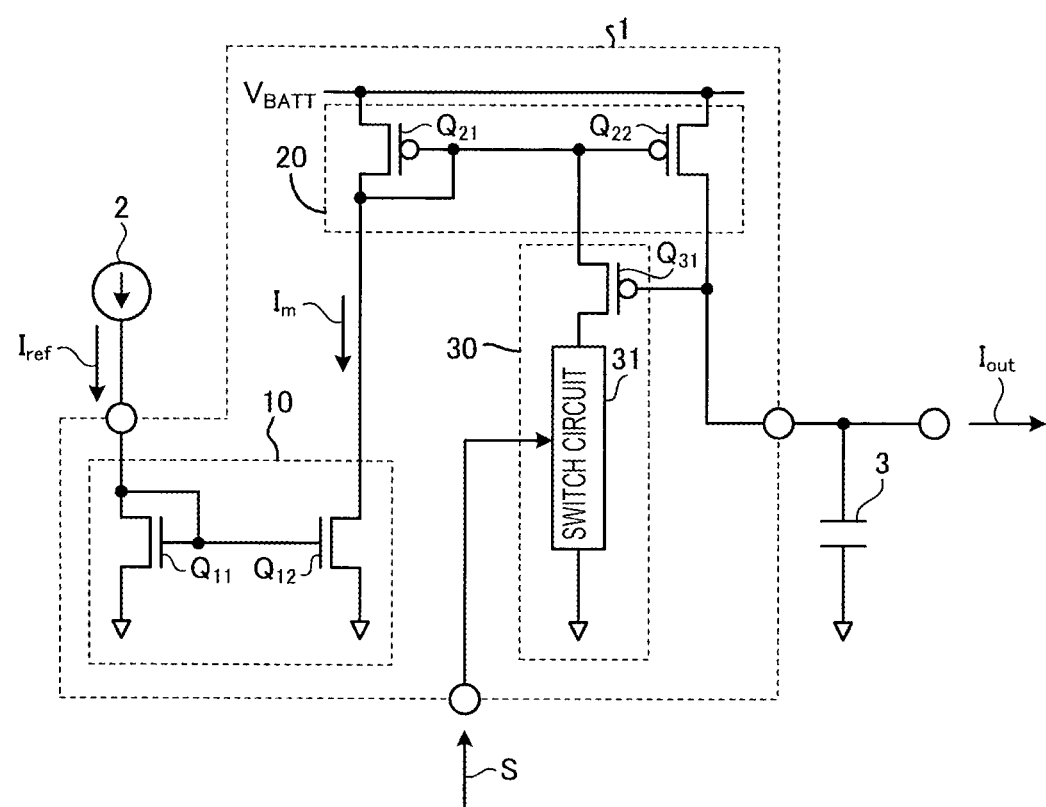
FIG. 2 is a diagram illustrating a circuit configuration of a current output circuit of a first embodiment.

FIG. 2 is a diagram illustrating a circuit configuration of a current output circuit of the first embodiment. Among the constituent elements of the current output circuit 1, the same constituent elements as those of the current output circuit 100 of the comparative example are denoted by the same reference signs, and the description thereof will be omitted.

The current output circuit 1 outputs the output current $I_{out}$ in response to the input current $I_{ref}$ inputted from the constant current source 2. The current output circuit 1 may be formed on one semiconductor chip (die).

The input current $I_{ref}$ corresponds to a "first current" of the present disclosure. The current $I_m$ outputted from the input circuit 10 corresponds to a "second current" of the present disclosure. The output current $I_{out}$ corresponds to a "third current" of the present disclosure.

The transistors $Q_{21}$ and $Q_{22}$ in the output circuit 20 correspond to the "transistors of a first group" of the present disclosure. The transistors $Q_{11}$ and $Q_{12}$ in the input circuit 10 correspond to the "transistors of a second group" of the present disclosure.

The current output circuit 1 further includes a control circuit 30 as compared with the current output circuit 100. The control circuit 30 includes a P-channel transistor $Q_{31}$ and a switch circuit 31. The transistor $Q_{31}$ in the control circuit 30 corresponds to a "control transistor" of the present disclosure.

A source of the transistor $Q_{31}$ is electrically connected to the gate and the drain of the transistor $Q_{21}$ and the gate of the transistor $Q_{22}$. A gate of the transistor $Q_{31}$ is electrically connected to the drain of the transistor $Q_{22}$, that is, an output terminal of the output circuit 20.

The switch circuit 31 is electrically connected between a drain of the transistor $Q_{31}$ and the reference electric potential. That is, the drain-source path of the transistor $Q_{31}$ and the switch circuit 31 are connected in series.

When a high level control signal S is inputted, the switch circuit 31 electrically connects the drain of the transistor $Q_{31}$ to the reference electric potential. The control signal S is assumed active-high, but the present disclosure is not limited thereto.

In the first embodiment, the switch circuit 31 is connected to a low electric potential side, and the transistor $Q_{31}$ is connected to a high electric potential side in series, but the present disclosure is not limited thereto. The transistor $Q_{31}$ may be connected to the low electric potential side, and the switch circuit 31 may be connected to the high electric potential side in series. That is, the drain of the transistor $Q_{31}$ may be electrically connected to the reference electric potential, and the switch circuit 31 may be electrically connected between the source of the transistor $Q_{31}$, and the gate and the drain of the transistor $Q_{21}$ and the gate of the transistor $Q_{22}$.

Note that the switch circuit 31 is preferably positioned on the lower electric potential side than the drain of the transistor $Q_{31}$. The switch circuit 31 causes a voltage drop. Accordingly, the source-gate voltage of the transistor $Q_{31}$ may be made higher than in the case that the switch circuit 31 is positioned on the higher electric potential side than the source of the transistor $Q_{31}$, and therefore the transistor $Q_{31}$ is more reliably turned on.

Figure 3:
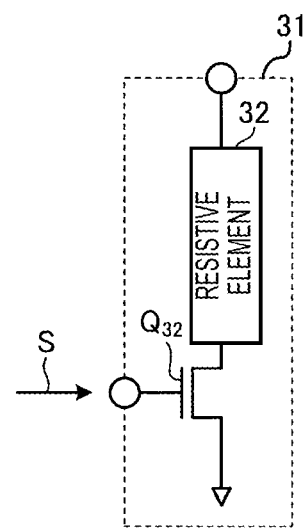
FIG. 3 is a diagram illustrating a circuit configuration of a switch circuit of the current output circuit of the first embodiment.

FIG. 3 is a diagram illustrating a circuit configuration of the switch circuit of the current output circuit of the first embodiment. The switch circuit 31 includes a resistive element 32 and an N-channel transistor $Q_{32}$.

The resistive element 32 may be any element that passes a direct current and causes a voltage drop. Examples of the resistive element 32 include a resistor, a diode, a transistor whose drain and gate are electrically connected to each other (diode-connected), and a wiring line (wiring resistance), but the present disclosure is not limited thereto.

One end of the resistive element 32 is electrically connected to the drain of the transistor $Q_{31}$ (see FIG. 2). A drain-source path of the transistor $Q_{32}$ is electrically connected between the other end of the resistive element 32 and the reference electric potential. The control signal S is inputted to a gate of the transistor $Q_{32}$.

When a high level control signal S is inputted, the transistor $Q_{32}$ is turned on. Thus, the drain of the transistor $Q_{31}$ (see FIG. 2) and the reference electric potential are electrically connected to each other.

The resistive element 32 causes a voltage drop when the transistors $Q_{31}$ and $Q_{32}$ are turned on. Accordingly, the voltage applied to the source-drain paths of the transistors $Q_{31}$ and $Q_{32}$ may be restrained. That is, the resistive element 32 serves to protect the transistors $Q_{31}$ and $Q_{32}$.

Further, although the transistor $Q_{31}$, the resistive element 32, and the transistor $Q_{32}$ are connected in series in this order from the high electric potential side toward the low electric potential side in the first embodiment, the present disclosure is not limited thereto. The order of connecting the transistor $Q_{31}$, the resistive element 32, and the transistor $Q_{32}$ may be different.

Note that the resistive element 32 is preferably positioned on the lower electric potential side than the drain of the transistor $Q_{31}$. The resistive element 32 causes a voltage drop. Accordingly, the source-gate voltage of the transistor $Q_{31}$ may be made higher than in the case that the resistive element 32 is positioned on the higher electric potential side than the source of the transistor $Q_{31}$, and therefore the transistor $Q_{31}$ is more reliably turned on.

Similarly, the transistor $Q_{32}$ is preferably positioned on the lower electric potential side than the drain of the transistor $Q_{31}$. The transistor $Q_{32}$ causes a voltage drop because of on-resistance. Accordingly, the source-gate voltage of the transistor $Q_{31}$ may be made higher than in the case that the transistor $Q_{32}$ is positioned on the higher electric potential side than the source of the transistor $Q_{31}$, and therefore the transistor $Q_{31}$ is more reliably turned on.

Accordingly, the transistor $Q_{31}$ is preferably positioned on the highest electric potential side in the control circuit 30. That is, the source of the transistor $Q_{31}$ is preferably electrically connected to the gate and the drain of the transistor $Q_{21}$ and the gate of the transistor $Q_{22}$.

The resistive element 32 is preferably positioned on the higher electric potential side than the drain of the transistor $Q_{32}$. The resistive element 32 causes a voltage drop. Accordingly, the source-gate voltage of the transistor $Q_{32}$ may be made higher than in the case that the resistive element 32 is positioned on the lower electric potential side than the source of the transistor $Q_{32}$, and therefore the transistor $Q_{32}$ is more reliably turned on.

Accordingly, the transistor $Q_{32}$ is preferably positioned on the lowest electric potential side in the control circuit 30. That is, the source of the transistor $Q_{32}$ is preferably electrically connected to the reference electric potential.

In view of the above, the transistor $Q_{31}$, the resistive element 32, and the transistor $Q_{32}$ are preferably connected in series in this order from the high electric potential side toward the low electric potential side.

The operation of the current output circuit 1 in activation (start of inputting the input current $I_{ref}$) will be described.

Before the activation of the current output circuit 1, the input current $I_{ref}$ is zero amperes. Accordingly, the current $I_m$ and the output current $I_{out}$ are also zero amperes. At this time, an electric charge amount of the capacitor 3 may be small. The voltage of the capacitor 3 is proportional to the electric charge amount. That is, the voltage of the capacitor 3 may be a low voltage.

For example, the electric charge amount of the capacitor 3 may be zero coulombs. That is, the voltage of the capacitor 3 may be zero volts.

Before the start of inputting the input current $I_{ref}$, a high level control signal S is inputted to the switch circuit 31. When the high level control signal S is inputted, the switch circuit 31 electrically connects the drain of the transistor $Q_{31}$ to the reference electric potential.

When the terminal of the capacitor 3 on the high electric potential side has a low electric potential (zero volts, for example), the low electric potential (zero volts, for example) is inputted to the gate of the transistor $Q_{31}$, and the transistor $Q_{31}$ is turned on. Thus, a low electric potential is inputted to the gate of the transistor $Q_{22}$. Accordingly, since the transistor $Q_{22}$ is turned on, a drain current flows through the source-drain path of the transistor $Q_{22}$. The drain current of the transistor $Q_{22}$ makes the capacitor 3 accumulate the electric charge.

The drain current of the transistor $Q_{22}$ at this time is a current based on the source-gate voltage of the transistor $Q_{22}$. Note that the drain current of the transistor $Q_{22}$ at this time may be the same as or different from the output current $I_{out}$.

When the electric charge is accumulated in the capacitor 3 and the electric potential of the terminal of the capacitor 3 on the high electric potential side exceeds the threshold electric potential for the operation of the gate of the transistor $Q_{31}$, the transistor $Q_{31}$ is turned off. The threshold electric potential for the operation of the gate of the transistor $Q_{31}$ corresponds to the "threshold voltage" of the present disclosure, for example. Thus, the input of the low electric potential to the gate of the transistor $Q_{22}$ is completed. Accordingly, the transistor $Q_{22}$ is turned off, and the drain current of the transistor $Q_{22}$ stops. Thus, the current output circuit 1 may reduce the power consumption.

Thereafter, the constant current source 2 outputs the input current $I_{ref}$ to the current output circuit 1. At this time, the control signal S is preferably at a low level, but may remain in the high level. This is because the increase in the electric potential of the terminal of the capacitor 3 on the high electric potential side makes the transistor $Q_{31}$ be turned off as described above, even in the case that the control signal S remains in the high level.

When the constant current source 2 outputs the input current $I_{ref}$, the current output circuit 1 starts outputting the output current $I_{out}$. At this time, the electric charge is accumulated in the capacitor 3, and a voltage (voltage corresponding to the threshold voltage for the operation of the gate of the transistor $Q_{31}$, for example) is generated in the capacitor 3. Accordingly, the voltage applied to the source-drain path of the transistor $Q_{22}$ is the voltage obtained by subtracting the voltage of the capacitor 3 from the voltage $V_{BATT}$.

As described above, when the high level control signal S is inputted, the current output circuit 1 controls the transistor $Q_{22}$ to be turned on and makes the capacitor 3 accumulate the electric charge. Thus, the current output circuit 1 may restrain the voltage to be applied to the source-drain path of the transistor $Q_{22}$ when the input current $I_{ref}$ is inputted. Accordingly, the current output circuit 1 may reduce the concern about the transistor $Q_{22}$ being damaged, and may reduce the concern about reliability.

When the constant current source 2 outputs the input current $I_{ref}$, the electric charge is accumulated in the capacitor 3. Accordingly, the current output circuit 1 may reduce the amount of the electric charge to be charged in the capacitor 3 by the output current $I_{out}$, and therefore may reduce the delay of the output current $I_{out}$.

Further, when the current output circuit 1 performs the current output operation (when the input current $I_{ref}$ is inputted and the current output circuit 1 outputs the output current $I_{out}$), the transistor $Q_{31}$ is turned off. That is, the transistor $Q_{31}$ is turned off regardless of ON or OFF of the switch circuit 31. Accordingly, the control circuit 30 may reduce the influence on the output characteristic of the current output circuit 1.

Note that even in a case that the rise of the power supply electric potential $V_{BATT}$ is fast and the capacitance value of the capacitor 3 is large, the control circuit 30 may reduce the influence on the output characteristic of the current output circuit 1.

Second Embodiment

Figure 4:
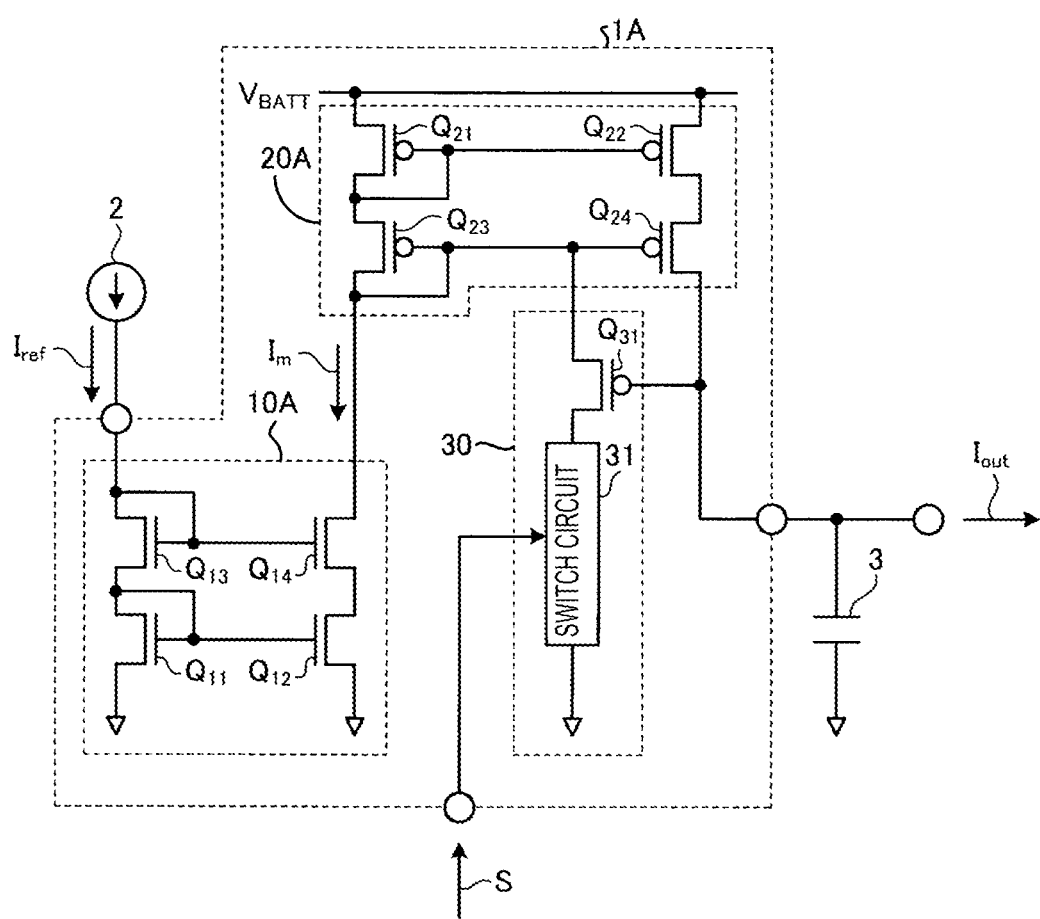
FIG. 4 is a diagram illustrating a circuit configuration of a current output circuit of a second embodiment.

FIG. 4 is a diagram illustrating a circuit configuration of a current output circuit of the second embodiment. Among the constituent elements of a current output circuit 1A, the same constituent elements as those of the current output circuit 1 of the first embodiment are denoted by the same reference signs, and the description thereof will be omitted.

The current output circuit 1A includes an input circuit 10A instead of the input circuit 10 as compared with the current output circuit 1. Further, the current output circuit 1A includes an output circuit 20A instead of the output circuit 20 as compared with the current output circuit 1.

The input circuit 10A further includes N-channel transistors $Q_{13}$ and $Q_{14}$ as compared with the input circuit 10.

The transistors $Q_{11}$, $Q_{12}$, $Q_{13}$, and $Q_{14}$ in the input circuit 10A correspond to the "transistors of a second group" of the present disclosure.

A source of the transistor $Q_{13}$ is electrically connected to the gate and the drain of the transistor $Q_{11}$ and the gate of the transistor $Q_{12}$. A drain and a gate of the transistor $Q_{13}$ are electrically connected to each other. The input current $I_{ref}$ is inputted to the drain and the gate of the transistor $Q_{13}$.

A source of the transistor $Q_{14}$ is electrically connected to the drain of the transistor $Q_{12}$. A gate of the transistor $Q_{14}$ is electrically connected to the gate of the transistor $Q_{13}$.

That is, the transistors $Q_{11}$, $Q_{12}$, $Q_{13}$, and $Q_{14}$ configure a cascode current mirror circuit.

The input circuit 10 described in the first embodiment is a current mirror circuit. In the current mirror circuit, the current $I_m$, which is the drain current of the transistor $Q_{12}$, varies or fluctuates because of the variation or fluctuation in the drain-source voltage of the transistor $Q_{12}$, that is, because of the variation or fluctuation in the power supply electric potential $V_{BATT}$.

Whereas, the input circuit 10A described in the second embodiment is the cascode current mirror circuit. In the input circuit 10A, which is the cascode current mirror circuit, the source-gate voltage of the transistor $Q_{13}$ and the source-gate voltage of the transistor $Q_{14}$ are equal to each other. That is, the electric potential of the drain of the transistor $Q_{11}$ and the electric potential of the drain of the transistor $Q_{12}$ are equal to each other. Accordingly, the variation or fluctuation in the drain-source voltage of the transistor $Q_{12}$ is reduced. Thus, the variation or fluctuation in the current $I_m$ is reduced.

The output circuit 20A further includes P-channel transistors $Q_{23}$ and $Q_{24}$ as compared with the output circuit 20.

The transistors $Q_{21}$, $Q_{22}$, $Q_{23}$, and $Q_{24}$ in the output circuit 20A correspond to the "transistors of a first group" of the present disclosure.

A source of the transistor $Q_{23}$ is electrically connected to the gate and the drain of the transistor $Q_{21}$ and the gate of the transistor $Q_{22}$. A drain and a gate of the transistor $Q_{23}$ are electrically connected to each other. The drain and the gate of the transistor $Q_{23}$ are electrically connected to a drain of the transistor $Q_{14}$. Accordingly, the drain current of the transistor $Q_{23}$ is the current $I_m$.

A source of the transistor $Q_{24}$ is electrically connected to the drain of the transistor $Q_{22}$. A gate of the transistor $Q_{24}$ is electrically connected to the gate of the transistor $Q_{23}$.

That is, the transistors $Q_{21}$, $Q_{22}$, $Q_{23}$, and $Q_{24}$ configure a cascode current mirror circuit.

The output circuit 20A is the cascode current mirror circuit. In the output circuit 20A, which is the cascode current mirror circuit, the source-gate voltage of the transistor $Q_{23}$ and the source-gate voltage of the transistor $Q_{24}$ are equal to each other. That is, the electric potential of the drain of the transistor $Q_{21}$ and the electric potential of the drain of the transistor $Q_{22}$ are equal to each other. Accordingly, the variation or fluctuation in the drain-source voltage of the transistor $Q_{22}$ is reduced. Thus, the variation or fluctuation in the output current $I_{out}$ is reduced.

The source of the transistor $Q_{31}$ in the control circuit 30 is electrically connected to the gate and the drain of the transistor $Q_{23}$ and the gate of the transistor $Q_{24}$. The gate of the transistor $Q_{31}$ is electrically connected to a drain of the transistor $Q_{24}$, that is, an output terminal of the output circuit 20A.

The operation of the current output circuit 1A in activation (start of inputting the input current $I_{ref}$) will be described.

Before the start of inputting the input current $I_{ref}$, a high level control signal S is inputted to the switch circuit 31. When the high level control signal S is inputted, the switch circuit 31 electrically connects the drain of the transistor $Q_{31}$ to the reference electric potential.

When the terminal of the capacitor 3 on the high electric potential side has a low electric potential (zero volts, for example), the low electric potential (zero volts, for example) is inputted to the gate of the transistor $Q_{31}$, and the transistor $Q_{31}$ is turned on. Thus, a low electric potential is inputted to the gates of the transistors $Q_{23}$ and $Q_{24}$. Accordingly, the transistors $Q_{23}$ and $Q_{24}$ are turned on. Since the transistor $Q_{23}$ is turned on, a low electric potential is inputted to the gates of the transistors $Q_{21}$ and $Q_{22}$. Accordingly, the transistors $Q_{21}$ and $Q_{22}$ are turned on.

Since the transistors $Q_{22}$ and $Q_{24}$ are turned on, a current flows through the source-drain paths of the transistors $Q_{22}$ and $Q_{24}$. The current flowing through the source-drain paths of the transistors $Q_{22}$ and $Q_{24}$ makes the capacitor 3 accumulate the electric charge.

The current flowing through the source-drain paths of the transistors $Q_{22}$ and $Q_{24}$ at this time is a current based on the source-gate voltages of the transistors $Q_{22}$ and $Q_{24}$. Note that the current flowing through the source-drain paths of the transistors $Q_{22}$ and $Q_{24}$ at this time may be the same as or different from the output current $I_{out}$.

When the electric charge is accumulated in the capacitor 3 and the electric potential of the terminal of the capacitor 3 on the high electric potential side exceeds the threshold electric potential for the operation of the gate of the transistor $Q_{31}$, the transistor $Q_{31}$ is turned off. Thus, the input of the low electric potential to the gates of the transistors $Q_{21}$, $Q_{22}$, $Q_{23}$, and $Q_{24}$ is completed. Accordingly, the transistors $Q_{22}$ and $Q_{24}$ are turned off, and the current flowing through the source-drain paths of the transistors $Q_{22}$ and $Q_{24}$ stops. Thus, the current output circuit 1A may reduce the power consumption.

Thereafter, the constant current source 2 outputs the input current $I_{ref}$ to the current output circuit 1A. At this time, the control signal S is preferably at a low level, but may remain in the high level. This is because the increase in the voltage of the capacitor 3 makes the transistor $Q_{31}$ be turned off as described above, even in the case that the control signal S remains in the high level.

When the constant current source 2 outputs the input current $I_{ref}$, the current output circuit 1A starts outputting the output current $I_{out}$. At this time, the electric charge is accumulated in the capacitor 3, and a voltage (voltage corresponding to the threshold voltage for the operation of the gate of the transistor $Q_{31}$, for example) is generated in the capacitor 3. Accordingly, the voltage applied to the source-drain paths of the transistors $Q_{22}$ and $Q_{24}$ is the voltage obtained by subtracting the voltage of the capacitor 3 from the voltage $V_{BATT}$.

As described above, when the high level control signal S is inputted, the current output circuit 1A controls the transistor $Q_{22}$ and $Q_{24}$ to be turned on and makes the capacitor 3 accumulate the electric charge. Thus, the current output circuit 1A may restrain the voltage to be applied to the source-drain paths of the transistors $Q_{22}$ and $Q_{24}$ when the input current $I_{ref}$ is inputted. Accordingly, the current output circuit 1A may reduce the concern about the transistors $Q_{22}$ and $Q_{24}$ being damaged, and may reduce the concern about reliability.

When the constant current source 2 outputs the input current $I_{ref}$, the electric charge is accumulated in the capacitor 3. Accordingly, the current output circuit 1A may reduce the amount of the electric charge to be charged in the capacitor 3 by the output current $I_{out}$, and therefore may reduce the delay of the output current $I_{out}$.

Further, when the current output circuit 1A performs the current output operation (when the input current $I_{ref}$ is inputted and the current output circuit 1A outputs the output current $I_{out}$, the transistor $Q_{31}$ is turned off. Accordingly, the control circuit 30 may reduce the influence on the output characteristic of the current output circuit 1A.

Third Embodiment

Figure 5:
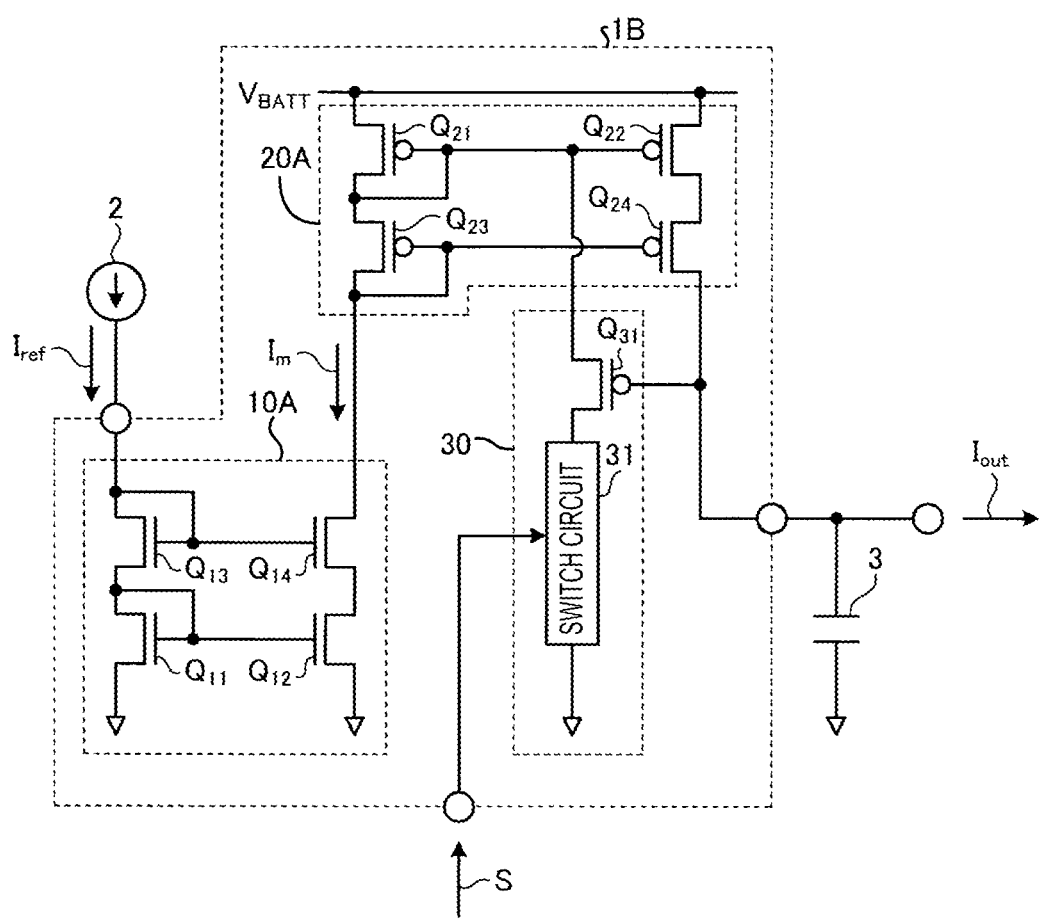
FIG. 5 is a diagram illustrating a circuit configuration of a current output circuit of a third embodiment.

FIG. 5 is a diagram illustrating a circuit configuration of a current output circuit of a third embodiment. Among the constituent elements of a current output circuit 1B, the same constituent elements as those of the current output circuit 1A of the second embodiment are denoted by the same reference signs, and the description thereof will be omitted.

In the current output circuit 1B, the source of the transistor $Q_{31}$ is electrically connected to the gate and the drain of the transistor $Q_{21}$ and the gate of the transistor $Q_{22}$ as compared with the current output circuit 1A.

The operation of the current output circuit 1B in activation (start of inputting the input current $I_{ref}$) will be described.

Before inputting a high level control signal S to the switch circuit 31, the power supply electric potential $V_{BATT}$ is applied to the output circuit 20A. At this time, the transistors $Q_{12}$ and $Q_{14}$ in the input circuit 10A are off, and no current $I_{in}$ flows. Each of the transistors $Q_{21}$ and $Q_{23}$ is diode-connected. Accordingly, a weak current transiently flows through the transistors $Q_{21}$ and $Q_{23}$.

Figure 6:
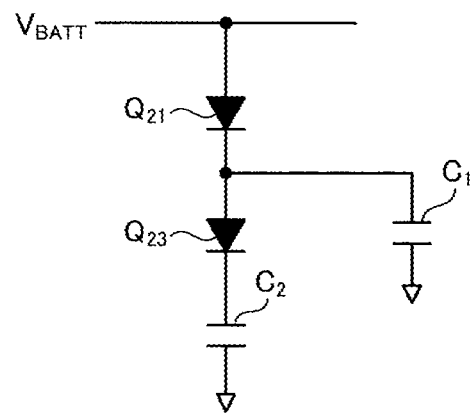
FIG. 6 is a diagram illustrating an equivalent circuit of the current output circuit of the third embodiment.

FIG. 6 is a diagram illustrating an equivalent circuit of a part of the current output circuit of the third embodiment. Specifically, FIG. 6 is a diagram illustrating an equivalent circuit of the diode-connected transistors $Q_{21}$ and $Q_{23}$ when the power supply electric potential $V_{BATT}$ is applied to the output circuit 20A.

In FIG. 6, a capacitance $C_1$ is the parasitic capacitance of the gates of the transistors $Q_{21}$ and $Q_{22}$. For example, the capacitance $C_1$ is the sum of the gate capacitance and the wiring capacitance of the transistors $Q_{21}$ and $Q_{22}$. The capacitance $C_2$ is the parasitic capacitance of the gates of the transistors $Q_{23}$ and $Q_{24}$. For example, the capacitance $C_2$ is the sum of the gate capacitance and the wiring capacitance of the transistors $Q_{23}$ and $Q_{24}$.

The capacitance $C_1$ and the capacitance $C_2$ are charged by a weak current transiently flowing through the transistors $Q_{21}$ and $Q_{23}$. Accordingly, the electric potential of the gate of each of the transistors $Q_{21}$ and $Q_{23}$ is settled to some electric potential near the threshold electric potential.

Referring to FIG. 5 again, a high level control signal S is inputted to the switch circuit 31. When the high level control signal S is inputted, the switch circuit 31 electrically connects the drain of the transistor $Q_{31}$ to the reference electric potential.

When the terminal of the capacitor 3 on the high electric potential side has a low electric potential (zero volts, for example), the low electric potential (zero volts, for example) is inputted to the gate of the transistor $Q_{31}$, and the transistor $Q_{31}$ is turned on. Thus, a low electric potential is inputted to the gates of the transistors $Q_{21}$ and $Q_{22}$. Accordingly, the transistors $Q_{21}$ and $Q_{22}$ are turned on.

Since the transistor $Q_{21}$ is turned on, the electric potential of the source of the transistor $Q_{23}$ becomes the electric potential obtained by subtracting the voltage drop in the source-drain path of the transistor $Q_{21}$ from the power supply electric potential $V_{BATT}$. Accordingly, since a voltage is applied between the source and the gate of the transistor $Q_{23}$, the transistor $Q_{23}$ is turned on and the transistor $Q_{24}$ is also turned on.

Since the transistors $Q_{22}$ and $Q_{24}$ are turned on, a current flows through the source-drain paths of the transistors $Q_{22}$ and $Q_{24}$. The current flowing through the source-drain paths of the transistors $Q_{22}$ and $Q_{24}$ makes the capacitor 3 accumulate the electric charge.

The current flowing through the source-drain paths of the transistors $Q_{22}$ and $Q_{24}$ at this time is a current based on the source-gate voltages of the transistors $Q_{22}$ and $Q_{24}$. Note that the current flowing through the source-drain paths of the transistors $Q_{22}$ and $Q_{24}$ at this time may be the same as or different from the output current $I_{out}$.

When the electric charge is accumulated in the capacitor 3 and the electric potential of the terminal of the capacitor 3 on the high electric potential side exceeds the threshold electric potential for the operation of the gate of the transistor $Q_{31}$, the transistor $Q_{31}$ is turned off. Thus, the input of the low electric potential to the gates of the transistors $Q_{21}$, $Q_{22}$, $Q_{23}$, and $Q_{24}$ is completed. Accordingly, the transistors $Q_{22}$ and $Q_{24}$ are turned off, and the current flowing through the source-drain paths of the transistors $Q_{22}$ and $Q_{24}$ stops. Thus, the current output circuit 1B may reduce the power consumption.

Thereafter, the constant current source 2 outputs the input current $I_{ref}$ to the current output circuit 1B. At this time, the control signal S is preferably at a low level, but may remain in the high level. This is because the increase in the voltage of the capacitor 3 makes the transistor $Q_{31}$ be turned off as described above, even in the case that the control signal S remains in the high level.

When the constant current source 2 outputs the input current $I_{ref}$, the current output circuit 1B starts outputting the output current $I_{out}$. At this time, the electric charge is accumulated in the capacitor 3, and a voltage (voltage corresponding to the threshold voltage for the operation of the gate of the transistor $Q_{31}$, for example) is generated in the capacitor 3. Accordingly, the voltage applied to the source-drain paths of the transistors $Q_{22}$ and $Q_{24}$ is the voltage obtained by subtracting the voltage of the capacitor 3 from the voltage $V_{BATT}$.

As described above, when the high level control signal S is inputted, the current output circuit 1B controls the transistor $Q_{22}$ and $Q_{24}$ to be turned on and makes the capacitor 3 accumulate the electric charge. Thus, the current output circuit 1B may restrain the voltage applied to the source-drain paths of the transistors $Q_{22}$ and $Q_{24}$ when the input current $I_{ref}$ is inputted. Accordingly, the current output circuit 1B may reduce the concern about the transistors $Q_{22}$ and $Q_{24}$ being damaged, and may reduce the concern about reliability.

When the constant current source 2 outputs the input current $I_{ref}$, the electric charge is accumulated in the capacitor 3. Accordingly, the current output circuit 1B may reduce the amount of electric charge to be charged in the capacitor 3 by the output current $I_{out}$, and therefore the delay of the output current $I_{out}$ may be reduced.

Further, when the current output circuit 1B performs the current output operation (when the input current $I_{ref}$ is inputted and the current output circuit 1B outputs the output current $I_{out}$, the transistor $Q_{31}$ is turned off. Accordingly, the control circuit 30 may reduce the influence on the output characteristic of the current output circuit 1B.

Fourth Embodiment

Figure 7:
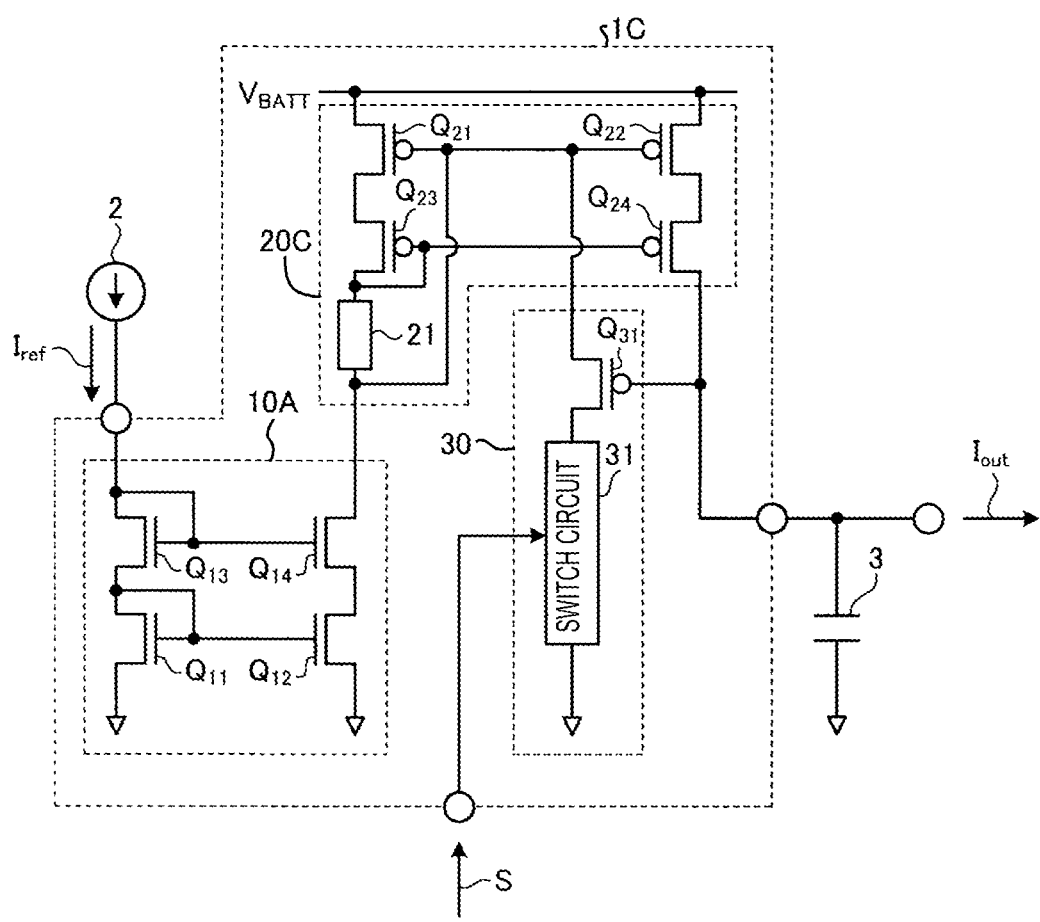
FIG. 7 is a diagram illustrating a circuit configuration of a current output circuit of a fourth embodiment.

FIG. 7 is a diagram illustrating a circuit configuration of a current output circuit of a fourth embodiment. Among the constituent elements of a current output circuit 1C, the same constituent elements as those of the current output circuit 1B of the third embodiment are denoted by the same reference signs, and the description thereof will be omitted.

The current output circuit 1C includes an output circuit 20C instead of the output circuit 20A as compared with the current output circuit 1B.

The output circuit 20C further includes a resistive element 21 as compared with the output circuit 20A.

The resistive element 21 may be any element that passes a direct current and causes a voltage drop. Examples of the resistive element 21 include a resistor, a diode, a diode-connected transistor, and a wiring line (wiring resistance), but the present disclosure is not limited thereto.

One end of the resistive element 21 is electrically connected to the drain of the transistor $Q_{14}$. The other end of the resistive element 21 is electrically connected to the drain and the gate of the transistor $Q_{23}$ and the gate of the transistor $Q_{24}$.

The gate of the transistor $Q_{21}$ is electrically connected to the one end of the resistive element 21 and the drain of the transistor $Q_{14}$.

Accordingly, when the output current $I_{out}$ of the current output circuit 1C is outputted, the electric potential of the gates of the transistors $Q_{21}$ and $Q_{22}$ of the output circuit 20C is lower than the electric potential of the gates of the transistors $Q_{21}$ and $Q_{22}$ of the output circuit 20A by the voltage drop in the source-drain path of the transistor $Q_{23}$ and the resistive element 21. That is, the drain current of the transistor $Q_{22}$ of the output circuit 20C is larger than the drain current of the transistor $Q_{22}$ of the output circuit 20A.

Accordingly, the current output circuit 1C may increase the output current $I_{out}$ as compared with the current output circuit 1B. That is, the current output circuit 1C may adjust the output current $I_{out}$ by a resistance value of the resistive element 21.

The operation in activation of the current output circuit 1C (start of inputting the input current $I_{ref}$) is similar to the operation in activation of the current output circuit 1B, and thus description thereof will be omitted.

The current output circuit 1C exhibits the following effect in addition to the effects similar to those of the current output circuit 1B. The current output circuit 1C may adjust the output current $I_{out}$ by the resistance value of the resistive element 21.

Note that the fourth embodiment and the second embodiment may be combined. That is, the source of the transistor $Q_{31}$ may be electrically connected to the gate and the drain of the transistor $Q_{23}$ and the gate of the transistor $Q_{24}$.

Further, the fourth embodiment and the first embodiment may be combined. That is, in the current output circuit 1 (see FIG. 2), one end of the resistive element may be electrically connected to the drain of the transistor $Q_{12}$ and the gate of the transistor $Q_{21}$, and the other end of the resistive element may be electrically connected to the drain of the transistor $Q_{21}$.

Fifth Embodiment

Figure 8:
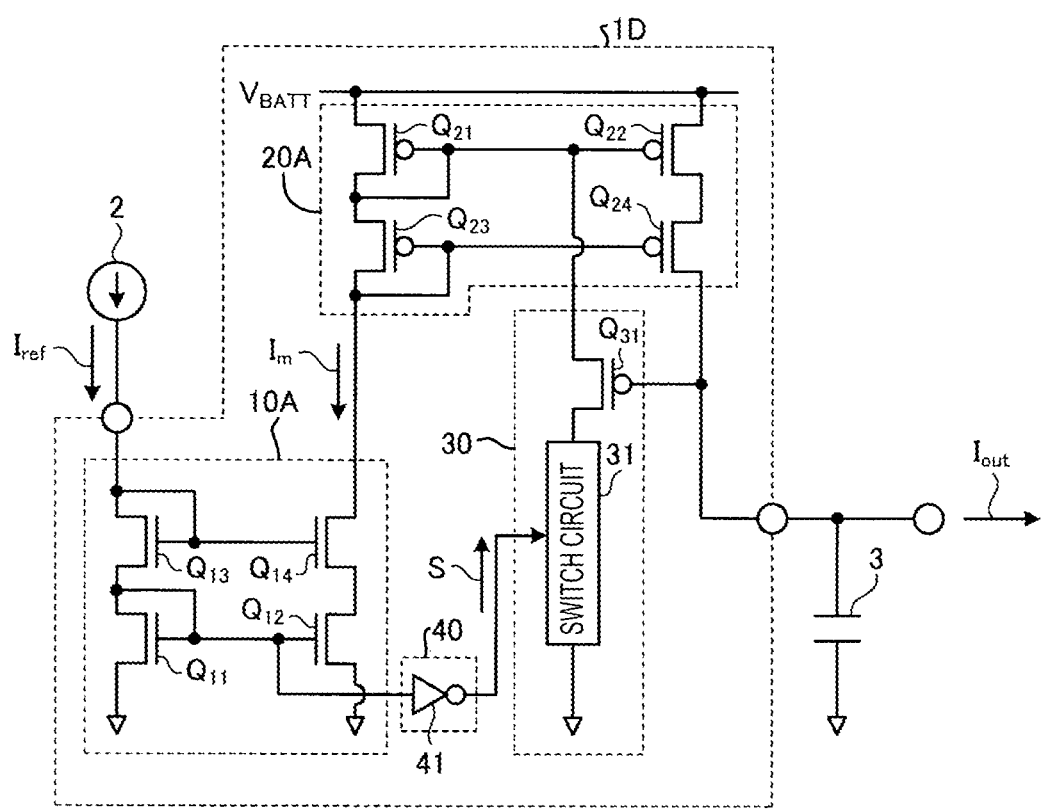
FIG. 8 is a diagram illustrating a circuit configuration of a current output circuit of a fifth embodiment.

FIG. 8 is a diagram illustrating a circuit configuration of a current output circuit of a fifth embodiment. Among the constituent elements of a current output circuit 1D, the same constituent elements as those of the current output circuit 1B of the third embodiment are denoted by the same reference signs, and the description thereof will be omitted.

The current output circuit 1D further includes a control signal output circuit 40 as compared with the current output circuit 1B. The control signal output circuit 40 includes an inverter circuit (inverting circuit) 41.

An input terminal of the inverter circuit 41 is electrically connected to the drain and the gate of the transistor $Q_{11}$ and the gate of the transistor $Q_{12}$.

The inverter circuit 41 outputs a high level control signal S to the switch circuit 31 when the electric potentials of the drain and the gate of the transistor $Q_{11}$ and the gate of the transistor $Q_{12}$ are in low levels.

The inverter circuit 41 outputs a low level control signal S to the switch circuit 31 when the electric potentials of the drain and the gate of the transistor $Q_{11}$ and the gate of the transistor $Q_{12}$ are at high levels.

The operation of the current output circuit 1D in activation (start of inputting the input current $I_{ref}$) will be described.

Before the activation of the current output circuit 1D, the input current $I_{ref}$ is zero amperes. Accordingly, the current $I_m$ is also zero amperes. At this time, the electric potentials of the drain and the gate of the transistor $Q_{11}$ and the gate of the transistor $Q_{12}$ are in low levels. Accordingly, the inverter circuit 41 outputs a high level control signal S to the switch circuit 31. When the high level control signal S is inputted, the switch circuit 31 electrically connects the drain of the transistor $Q_{31}$ to the reference electric potential.

At this time, an electric charge amount of the capacitor 3 may be small. The voltage of the capacitor 3 is proportional to the electric charge amount. That is, the voltage of the capacitor 3 may be a low voltage (zero volts, for example).

When the terminal of the capacitor 3 on the high electric potential side has a low electric potential (zero volts, for example), the low electric potential (zero volts, for example) is inputted to the gate of the transistor $Q_{31}$, and the transistor $Q_{31}$ is turned on. Thus, a low electric potential is inputted to the gates of the transistors $Q_{21}$ and $Q_{22}$. Accordingly, the transistors $Q_{21}$ and $Q_{22}$ are turned on.

Since the transistor $Q_{21}$ is turned on, the electric potential of the source of the transistor $Q_{23}$ becomes the electric potential obtained by subtracting the voltage drop in the source-drain path of the transistor $Q_{21}$ from the voltage $V_{BATT}$. Accordingly, since a voltage is applied between the source and the gate of the transistor $Q_{23}$, the transistor $Q_{23}$ is turned on and the transistor $Q_{24}$ is also turned on.

Since the transistors $Q_{22}$ and $Q_{24}$ are turned on, a current flows through the source-drain paths of the transistors $Q_{22}$ and $Q_{24}$. The current flowing through the source-drain paths of the transistors $Q_{22}$ and $Q_{24}$ makes the capacitor 3 accumulate the electric charge.

The current flowing through the source-drain paths of the transistors $Q_{22}$ and $Q_{24}$ at this time is a current based on the source-gate voltages of the transistors $Q_{22}$ and $Q_{24}$. Note that the current flowing through the source-drain paths of the transistors $Q_{22}$ and $Q_{24}$ at this time may be the same as or different from the output current $I_{out}$.

When the electric charge is accumulated in the capacitor 3 and the electric potential of the terminal of the capacitor 3 on the high electric potential side exceeds the threshold electric potential for the operation of the gate of the transistor $Q_{31}$, the transistor $Q_{31}$ is turned off. Thus, the input of the low electric potential to the gates of the transistors $Q_{21}$, $Q_{22}$, $Q_{23}$, and $Q_{24}$ is completed. Accordingly, the transistors $Q_{22}$ and $Q_{24}$ are turned off, and the current flowing through the source-drain paths of the transistors $Q_{22}$ and $Q_{24}$ stops. Thus, the current output circuit 1D may reduce the power consumption.

Thereafter, when the constant current source 2 outputs the input current $I_{ref}$, the input circuit 10A outputs the current $I_m$. At this time, the electric potentials of the drain and the gate of the transistor $Q_{11}$ and the gate of the transistor $Q_{12}$ are at high levels. Accordingly, the inverter circuit 41 outputs a low level control signal S to the switch circuit 31. The switch circuit 31 electrically disconnects the drain of the transistor $Q_{31}$ from the reference electric potential.

The output circuit 20A starts outputting the output current $I_{out}$. At this time, the electric charge is accumulated in the capacitor 3, and a voltage (voltage corresponding to the threshold voltage for the operation of the gate of the transistor $Q_{31}$, for example) is generated in the capacitor 3. Accordingly, the voltage applied to the source-drain paths of the transistors $Q_{22}$ and $Q_{24}$ is the voltage obtained by subtracting the voltage of the capacitor 3 from the voltage $V_{BATT}$.

The current output circuit 1D exhibits the following effect in addition to the effects similar to those of the current output circuit 1B. The current output circuit 1D may output the control signal S to the control circuit 30 by the control signal output circuit 40. Thus, the current output circuit 1D may eliminate the need to receive the control signal S from an external circuit.

Further, when the current output circuit 1D performs the current output operation (when the input current $I_{ref}$ is inputted), the control signal output circuit 40 outputs the control signal S at a low level. Accordingly, the transistor $Q_{31}$ is turned off. Thus, the control circuit 30 may reduce the influence on the output characteristic of the current output circuit 1D.

Note that the input terminal of the inverter circuit 41 may be electrically connected to the drain and the gate of the transistor $Q_{13}$ and the gate of the transistor $Q_{14}$.

Further, the fifth embodiment and the second embodiment may be combined. That is, the source of the transistor $Q_{31}$ may be electrically connected to the gate and the drain of the transistor $Q_{23}$ and the gate of the transistor $Q_{24}$.

Further, the fifth embodiment and the fourth embodiment may be combined. That is, the current output circuit 1D may include the output circuit 20C instead of the output circuit 20A.

Further, the fifth embodiment and the first embodiment may be combined. That is, in the current output circuit 1 (see FIG. 2), the input terminal of the control signal output circuit may be electrically connected to the gate of the transistor $Q_{12}$, and the control signal S outputted from the control signal output circuit may be inputted to the switch circuit 31.

Sixth Embodiment

Figure 9:
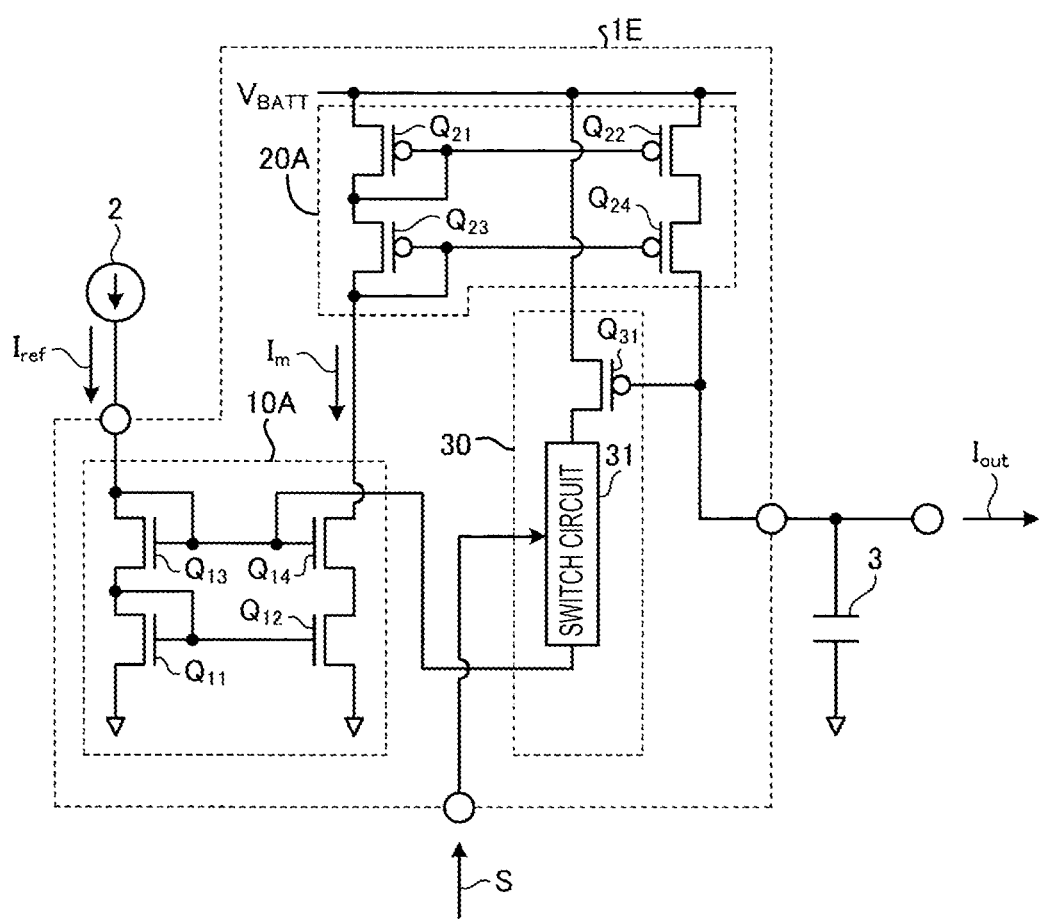
FIG. 9 is a diagram illustrating a circuit configuration of a current output circuit of a sixth embodiment.

FIG. 9 is a diagram illustrating a circuit configuration of a current output circuit of a sixth embodiment. Among the constituent elements of a current output circuit 1E, the same constituent elements as those of the current output circuit 1B of the third embodiment are denoted by the same reference signs, and the description thereof will be omitted.

The source of the transistor $Q_{31}$ in the control circuit 30 is electrically connected to the power supply electric potential $V_{BATT}$. The switch circuit 31 is electrically connected between the drain of the transistor $Q_{31}$, and the drain and the gate of the transistor $Q_{13}$ and the gate of the transistor $Q_{14}$.

The operation of the current output circuit 1E in activation (start of inputting the input current $I_{ref}$) will be described.

Before the start of inputting the input current $I_{ref}$, a high level control signal S is inputted to the switch circuit 31. When the high level control signal S is inputted, the switch circuit 31 electrically connects the drain of the transistor $Q_{31}$ and the gate of the transistor $Q_{14}$.

When the terminal of the capacitor 3 on the high electric potential side has a low electric potential (zero volts, for example), the low electric potential (zero volts, for example) is inputted to the gate of the transistor $Q_{31}$, and the transistor $Q_{31}$ is turned on. Thus, a high electric potential is inputted to the gate of the transistor $Q_{14}$. Accordingly, the transistors $Q_{13}$ and $Q_{14}$ are turned on. Since the transistor $Q_{13}$ is turned on, a high electric potential is inputted to the gates of the transistors $Q_{11}$ and $Q_{12}$. Accordingly, the transistors $Q_{11}$ and $Q_{12}$ are turned on.

Since the transistors $Q_{12}$ and $Q_{14}$ are turned on, a current flows through the drain-source paths of the transistors $Q_{12}$ and $Q_{14}$.

Note that the current flowing through the source-drain paths of the transistors $Q_{12}$ and $Q_{14}$ at this time may be the same as or different from the current $I_m$.

Accordingly, a current in response to the current flowing through the drain-source paths of the transistors $Q_{12}$ and $Q_{14}$ flows through the source-drain paths of the transistors $Q_{22}$ and $Q_{24}$. The current flowing through the source-drain paths of the transistors $Q_{22}$ and $Q_{24}$ makes the capacitor 3 accumulate the electric charge.

When the electric charge is accumulated in the capacitor 3 and the electric potential of the terminal of the capacitor 3 on the high electric potential side exceeds the threshold electric potential for the operation of the gate of the transistor $Q_{31}$, the transistor $Q_{31}$ is turned off. Thus, the input of the high electric potential to the gates of the transistors $Q_{11}$, $Q_{12}$, $Q_{13}$, and $Q_{14}$ is completed. Accordingly, the transistors $Q_{12}$ and $Q_{14}$ are turned off, and the current flowing through the source-drain paths of the transistors $Q_{12}$ and $Q_{14}$ stops. With this, the current flowing through the source-drain paths of the transistors $Q_{22}$ and $Q_{24}$ also stops. Thus, the current output circuit 1E may reduce the power consumption.

Thereafter, the constant current source 2 outputs the input current $I_{ref}$ to the current output circuit 1E. At this time, the control signal S is preferably at a low level, but may remain in the high level. This is because the increase in the voltage of the capacitor 3 makes the transistor $Q_{31}$ be turned off as described above, even in the case that the control signal S remains in the high level.

When the constant current source 2 outputs the input current $I_{ref}$, the current output circuit 1E starts outputting the output current $I_{out}$. At this time, the electric charge is accumulated in the capacitor 3, and a voltage (voltage corresponding to the threshold voltage for the operation of the gate of the transistor $Q_{31}$, for example) is generated in the capacitor 3. Accordingly, the voltage applied to the source-drain paths of the transistors $Q_{22}$ and $Q_{24}$ is the voltage obtained by subtracting the voltage of the capacitor 3 from the voltage $V_{BATT}$.

As described above, when the high level control signal S is inputted, the current output circuit 1E controls the transistor $Q_{12}$ and $Q_{14}$ to be turned on and makes the capacitor 3 accumulate the electric charge. Thus, the current output circuit 1E may restrain the voltage applied to the source-drain paths of the transistors $Q_{22}$ and $Q_{24}$ when the input current $I_{ref}$ is inputted. Accordingly, the current output circuit 1E may reduce the concern about the transistors $Q_{22}$ and $Q_{24}$ being damaged, and may reduce the concern about reliability.

When the constant current source 2 outputs the input current $I_{ref}$, the electric charge is accumulated in the capacitor 3. Accordingly, the current output circuit 1E may reduce the amount of electric charge to be charged in the capacitor 3 by the output current $I_{out}$, and therefore the delay of the output current $I_{out}$ may be reduced.

Further, when the current output circuit 1E performs the current output operation (when the input current $I_{ref}$ is inputted and the current output circuit 1E outputs the output current $I_{out}$), the transistor $Q_{31}$ is turned off. Accordingly, the control circuit 30 may reduce the influence on the output characteristic of the current output circuit 1E.

Note that one end of the switch circuit 31 may be electrically connected to the drain and the gate of the transistor $Q_{11}$ and the gate of the transistor $Q_{12}$.

Further, the sixth embodiment and the fourth embodiment may be combined. That is, the current output circuit 1E may include the output circuit 20C instead of the output circuit 20A.

Further, the sixth embodiment and the first embodiment may be combined. That is, in the current output circuit 1 (see FIG. 2), one end of the switch circuit 31 may be electrically connected to the gate of the transistor $Q_{12}$, and the source of the transistor $Q_{31}$ may be electrically connected to the power supply electric potential $V_{BATT}$.

APPLICATION EXAMPLE

Figure 10:
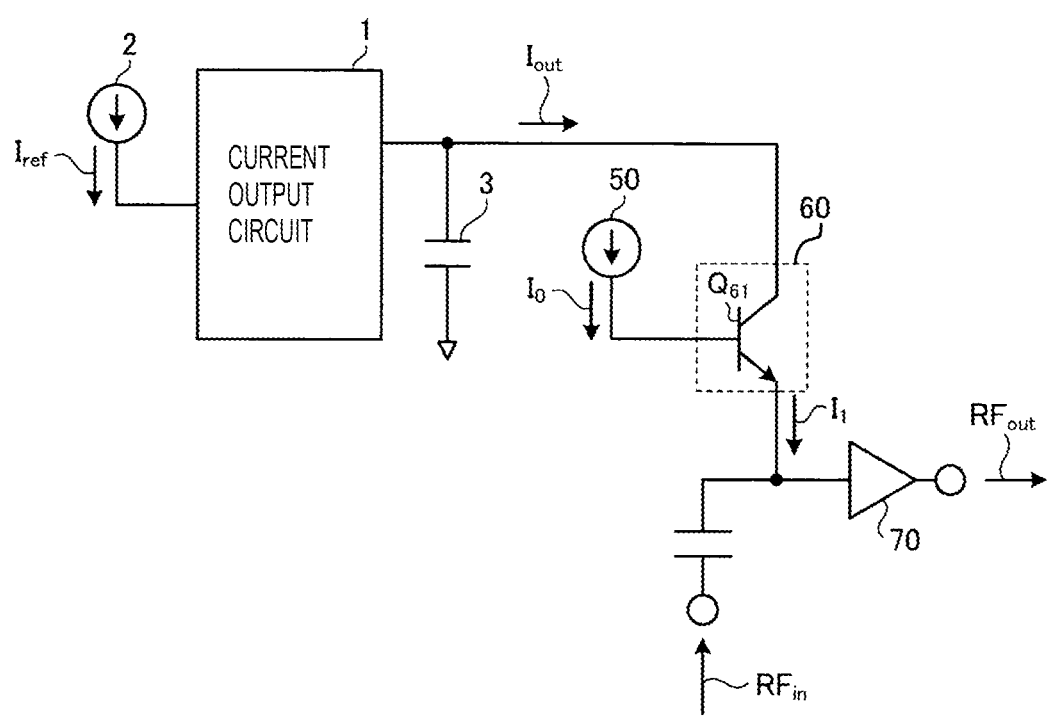
FIG. 10 is a diagram illustrating an application example of a current output circuit of an embodiment.

FIG. 10 is a diagram illustrating an application example of a current output circuit of an embodiment. Although FIG. 10 illustrates an application example of the current output circuit 1, each of the current output circuits 1A to 1E may be applied in the same manner as the current output circuit 1.

It should be noted that the above-described embodiments are intended to facilitate understanding of the present disclosure, and are not intended to limit the present disclosure. The present disclosure can be modified and improved without departing from the spirit thereof, and the present disclosure includes equivalents thereof.

1, 1A, 1B, 1C, 1D, 1E CURRENT OUTPUT CIRCUIT
2 CONSTANT CURRENT SOURCE
3 CAPACITOR
10, 10A INPUT CIRCUIT
20, 20A, 20C OUTPUT CIRCUIT
30 CONTROL CIRCUIT
31 SWITCH CIRCUIT
32 RESISTIVE ELEMENT
40 CONTROL SIGNAL OUTPUT CIRCUIT
$Q_{11}$, $Q_{12}$, $Q_{13}$, $Q_{14}$, $Q_{21}$, $Q_{22}$, $Q_{23}$, $Q_{24}$, $Q_{31}$, $Q_{32}$ TRANSISTOR

The invention claimed is:
1. A current output circuit, comprising:
an input circuit configured to output a second current in response to a first current when the first current is inputted to the input circuit;
an output circuit configured to output a third current in response to the second current; and
a control circuit configured to cause the output circuit to output a current when a control signal is inputted before the first current is inputted to the input circuit, wherein
the output circuit includes transistors of a first group, and
the input circuit includes transistors of a second group.
2. The current output circuit according to claim 1, wherein the transistors of the first group in the output circuit are arranged in a current mirror circuit or a cascode current mirror circuit.
3. The current output circuit according to claim 2, wherein the control circuit includes
a transistor having a gate electrically connected to an output terminal of the output circuit, and
a switch circuit being electrically conductive when the control signal is inputted, wherein
a source-drain path of the transistor and the switch circuit are connected in series between a gate of any of the transistors of the first group and a reference electric potential.
4. The current output circuit according to claim 2, wherein the transistors of the second group in the input circuit are arranged in a current mirror circuit or a cascode current mirror circuit, and the current output circuit further includes a control signal output circuit that outputs the control signal based on an electric potential of a gate of any of the transistors of the second group.

5. The current output circuit according to claim 2, wherein the control circuit causes the output circuit to stop outputting a current when a voltage of an output terminal of the output circuit exceeds a threshold voltage.

6. The current output circuit according to claim 2, wherein the control circuit outputs an electric potential to a gate of any of the transistors of the first group in the output circuit for turning on the any of the transistors of the first group when the control signal is inputted.

7. The current output circuit according to claim 2, further comprising
a capacitor for smoothing the third current, the capacitor being electrically connected to an output terminal of the output circuit.

8. The current output circuit according to claim 2, wherein the third current is outputted to a collector of a transistor in a bias circuit supplying a bias current to a power amplification circuit.

9. The current output circuit according to claim 1, wherein the control circuit includes
a transistor having a gate electrically connected to an output terminal of the output circuit, and
a switch circuit being electrically conductive when the control signal is inputted, wherein
a source-drain path of the transistor and the switch circuit are connected in series between a gate of any of the transistors of the first group and a reference electric potential.

10. The current output circuit according to claim 9, wherein
the transistors of the second group in the input circuit are arranged in a current mirror circuit or a cascode current mirror circuit, and
the current output circuit further includes a control signal output circuit that outputs the control signal based on an electric potential of a gate of any of the transistors of the second group.

11. The current output circuit according to claim 1, wherein
the transistors of the second group in the input circuit are arranged in a current mirror circuit or a cascode current mirror circuit, and
the current output circuit further includes a control signal output circuit that outputs the control signal based on an electric potential of a gate of any of the transistors of the second group.

12. The current output circuit according to claim 1, wherein
the control circuit causes the output circuit to stop outputting a current when a voltage of an output terminal of the output circuit exceeds a threshold voltage.

13. The current output circuit according to claim 1, wherein
the control circuit outputs an electric potential to a gate of any of the transistors of the first group in the output circuit for turning on the any of the transistors of the first group when the control signal is inputted.

14. The current output circuit according to claim 13, wherein
the control circuit stops outputting the electric potential when a voltage of an output terminal of the output circuit exceeds a threshold voltage.

15. The current output circuit according to claim 1, further comprising
a capacitor for smoothing the third current, the capacitor being electrically connected to an output terminal of the output circuit.

16. The current output circuit according to claim 1, wherein
the third current is outputted to a collector of a transistor in a bias circuit supplying a bias current to a power amplification circuit.

17. A current output circuit comprising:
an input circuit;
an output circuit connected between a power supply electric potential and the input circuit and configured to output a third current; and
a control circuit connected to the output circuit, wherein
the output circuit includes transistors of a first group,
the input circuit includes transistors of a second group,
the transistors of the first group and the transistors of the second group respectively include a plurality of transistors arranged in a current mirror circuit,
the control circuit includes a control transistor connected to the transistors of the first group and a switch circuit connected between the control transistor and a reference electric potential and performing switching in response to a control signal,
a gate of the control transistor is connected to a source or a drain of any of the plurality of transistors included in the transistors of the first group, and
one of a source or a drain of the control transistor is connected to a gate of any of the plurality of transistors included in the transistors of the first group, and the other of the source or the drain of the control transistor is connected to the switch circuit.

18. The current output circuit according to claim 17, wherein
the plurality of transistors included in the transistors of at least one group of the first group or the second group configure a plurality of current mirror circuits, and
the plurality of current mirror circuits configure a cascode current mirror circuit.

19. A current output circuit, comprising:
an input circuit configured to output a second current in response to a first current when the first current is inputted to the input circuit;
an output circuit configured to output a third current in response to a current; and
a control circuit configured to cause the input circuit to output the second current when a control signal is inputted before the first current is inputted to the input circuit.

20. The current output circuit according to claim 19, wherein
the input circuit configures a current mirror circuit or a cascode current mirror circuit,
the control circuit includes:
a transistor having a gate electrically connected to an output terminal of the output circuit and
a switch circuit being electrically conductive when the control signal is inputted, wherein
a source-drain path of the transistor and the switch circuit are connected in series between a gate of any of transistors of a second group in the input circuit and a power supply electric potential.

* * * * *